United States Patent [19]

Miura et al.

[11] Patent Number: 4,672,410
[45] Date of Patent: Jun. 9, 1987

[54] SEMICONDUCTOR MEMORY DEVICE WITH TRENCH SURROUNDING EACH MEMORY CELL

[75] Inventors: Kenji Miura, Isehara; Shigeru Nakajima, Chigasaki; Kazushige Minegishi, Atsugi; Takashi Morie; Toshifumi Somatani, both of Zama, all of Japan

[73] Assignee: Nippon Telegraph & Telephone, Tokyo, Japan

[21] Appl. No.: 753,283

[22] Filed: Jul. 9, 1985

[30] Foreign Application Priority Data

Jul. 12, 1984 [JP] Japan .................................. 59-143230
May 24, 1985 [JP] Japan .................................. 60-110128

[51] Int. Cl.⁴ ..................... H01L 29/78; H01L 27/02; H01L 29/06; H01L 29/04
[52] U.S. Cl. ......................... 357/23.6; 357/23.11; 357/41; 357/55; 357/59
[58] Field of Search ................. 357/23.6, 41, 55, 59, 357/23.11

[56] References Cited

U.S. PATENT DOCUMENTS 4,353,086 10/1982 Jaccodine et al. .............. 357/23.6

FOREIGN PATENT DOCUMENTS

| 85988 | 8/1983 | European Pat. Off. | .......... 357/23.6 |
| 108390 | 5/1984 | European Pat. Off. | .......... 357/23.6 |
| 51-130178 | 11/1976 | Japan | .................................. 357/23.6 |
| 54-121080 | 9/1979 | Japan | .................................. 357/23.6 |
| 56-30763 | 3/1981 | Japan | .................................. 357/23.6 |
| 56-43171 | 4/1981 | Japan | . |
| 59-19366 | 1/1984 | Japan | .................................. 357/23.6 |

OTHER PUBLICATIONS

"Depletion Trench Capacitor Technology for Megabit Level MOS dRAM" by T. Morie, K. Minegishi and S. Nakajima, IEEE Electron Device Letters, vol. EDL-4, No. 11, Nov. 1983.

"A Corrugated Capacitor (ell CCC) for Magabit Dynamic MOS Memories" by H. Sunami et al., IEEE Electron Device Letters, vol. EDL-4, No. 4, Apr. 1983, pp. 90-91.

"A Submicron CMOS Megabit Level RAM Technology Using Doped Face Trench Capacitor Cell" by K. Minegishi et al., reprinted from Proceedings of the IEEE International Electron Devices Meeting, Dec. 1983, pp. 319-322.

Primary Examiner—Gene M. Munson
Attorney, Agent, or Firm—Townsend & Townsend

[57] ABSTRACT

A semiconductor device has memory cells respectively located at intersections of bit and word lines arranged in a matrix form, each of the memory cells being constituted by a single insulated gate transistor and a single capacitor. One memory cell is formed in an element formation region defined by each of trenches arranged in a matrix form. The capacitor has an insulating film formed along part of a side wall surface of a trench formed in at least a direction of thickness of a semiconductor substrate and a conductive layer formed along the insulating film. The transistor has a gate insulating film adjacent to the capacitor and formed along a remaining portion of the side wall surface of the trench, a gate electrode formed along the gate insulating film, and a diffusion region formed in a major surface of the semiconductor substrate which is adjacent to the gate insulating film. The semicondcutor memory device further has an isolation region between two adjacent ones of the memory cells along two adjacent ones of the bit or word lines. A method of manufacturing the semiconductor is also proposed.

14 Claims, 74 Drawing Figures

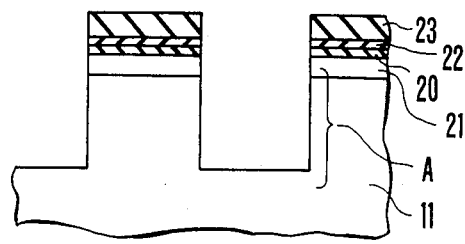
F I G. 4C
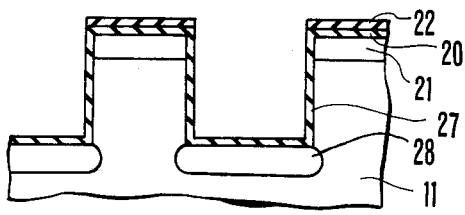
F I G. 4D
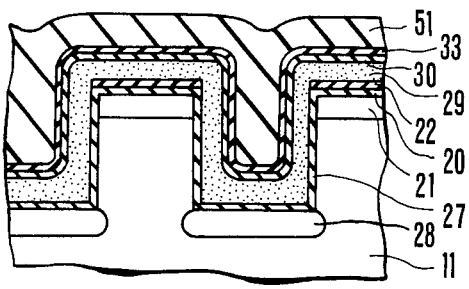
F I G. 4E
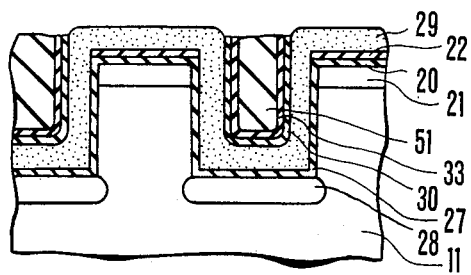
F I G. 4F

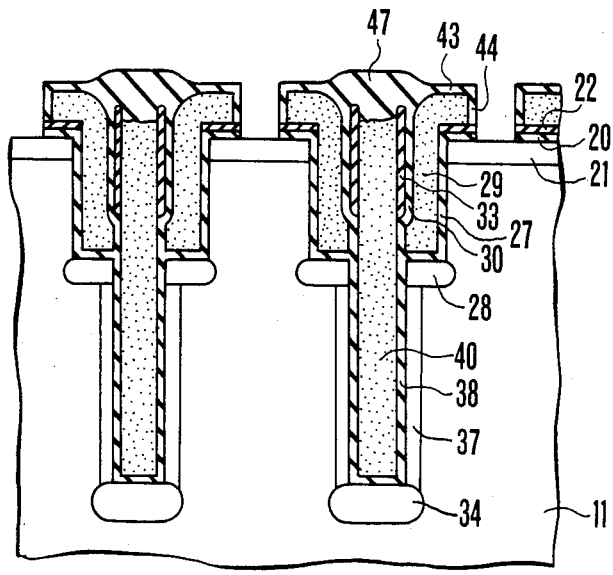
F I G. 4P
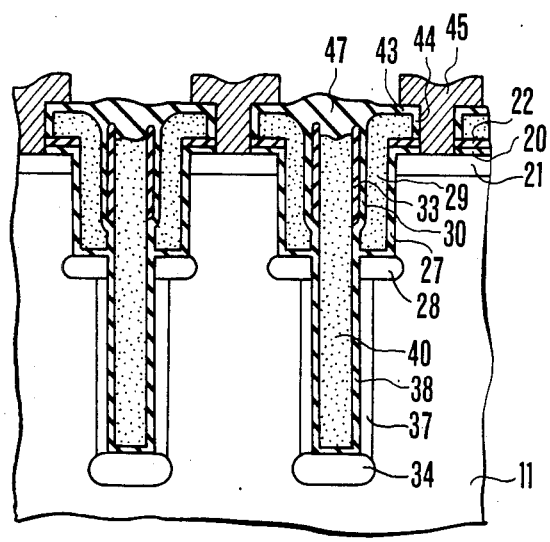
F I G. 4Q

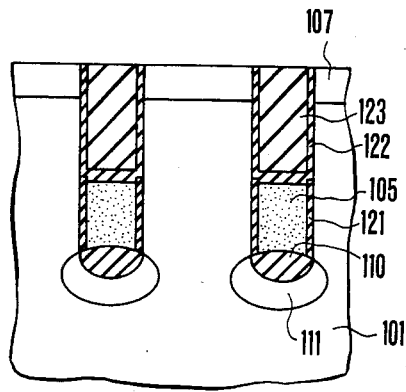
F I G. 11H
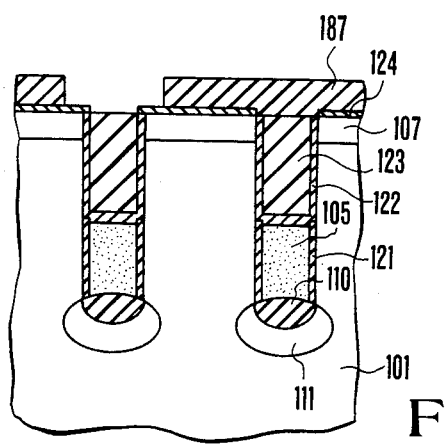
F I G. 11I
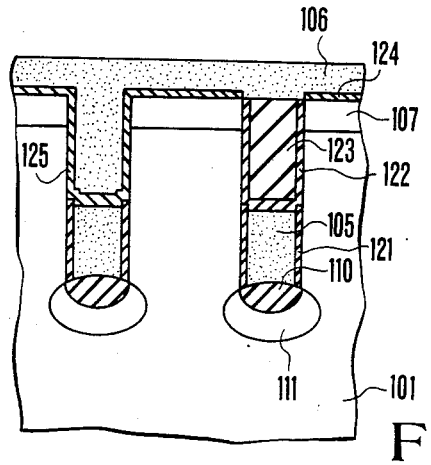
F I G. 11J

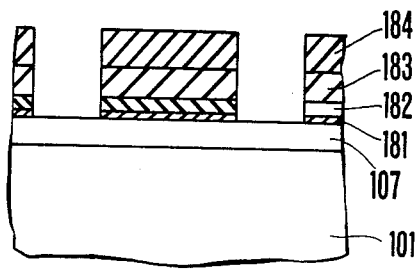
F I G. 12A
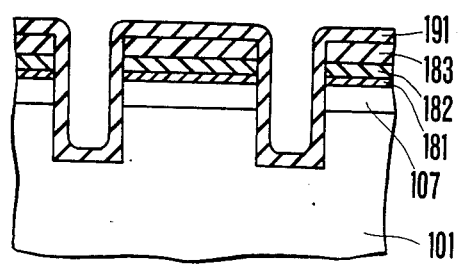
F I G. 12B
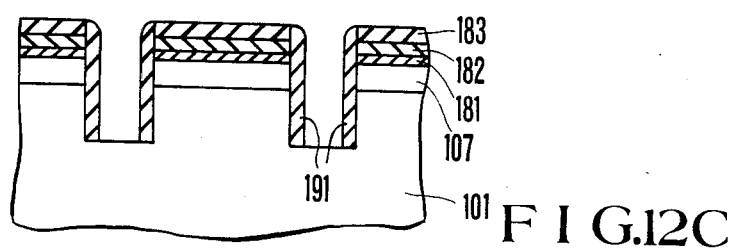
F I G. 12C
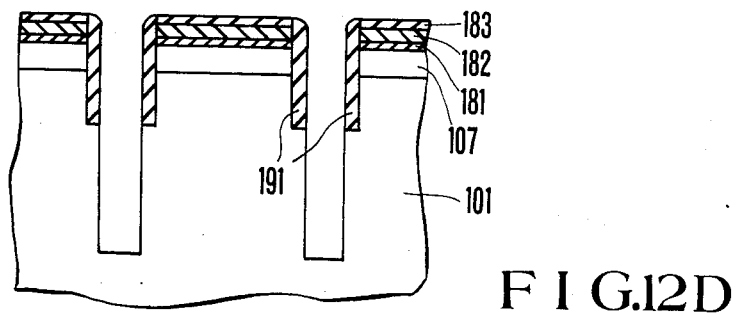
F I G. 12D

SEMICONDUCTOR MEMORY DEVICE WITH TRENCH SURROUNDING EACH MEMORY CELL

BACKGROUND OF THE INVENTION

The present invention relates to a semiconductor memory device and a method of manufacturing the same.

A currently most advanced random access memory (RAM) is exemplified by dynamic RAMs (to be referred to as 1Tr type dRAMs hereinafter) each having a cell structure consisting of one transistor and one capacitor. Among the 1Tcr type dRAMs, a memory cell structure, in that one bit line contact hole is commonly used for two adjacent cells is most advantageous for increasing the packing density of cells. This 1Tr type dRAM is widely employed.

A typical example is illustrated in FIGS. 1 and 2.

The following description will be made for n-channel MIS dRAMs of the prior art and the present invention. However, a p-channel MIS dRAM can also be prepared in the same manner as in the n-channel MIS dRAM by reversing the conductivity type of the silicon substrate, diffusion layers and a channel stopper and the polarity of the applied voltage. When an epitaxial layer or a well region is formed on a bulk semiconductor substrate, the epitaxial layer or the well region should be treated as the silicon substrate having the same polarity as the epitaxial layer or the well region.

Referring to FIG. 1, a region surrounded by a broken line represents a memory cell having one capacitor and one MIS transistor.

As shown in FIG. 2, the capacitor comprises a p-type silicon substrate 1, a thin insulating film 2 and a thin conductive layer 3. The thin insulating film 2 comprises: a silicon oxide film of 100 to 500 Å thickness obtained by thermally oxidizing the silicon substrate; a two-layer structure having a thermal oxide film and a silicon nitride film deposited by chemical vapor deposition (to be referred to as CVD hereinafter); or the like. The thin conductive layer 3 comprises phosphorus-doped polysilicon having a low electrical resistance, or a metal (e.g., molybdenum or aluminum).

A silicon oxide film 4 of 0.2 to 1.0 μm thickness and a channel stopper region 5 are formed around a pair of adjacent memory cells having a common contact hole 11 to be described later, thereby isolating the memory cells.

A MIS transistor serving as a transfer gate adjacent to the capacitor has n+-type diffusion layers 6 as source and drain, a gate insulating film 7 and a gate electrode 8 (i.e., a word line). A bit line 10 is connected to the n+-type diffusion layers 6 through the contact hole 11 formed in an insulating interlayer 9.

A positive voltage is applied to the thin conductive layer 3 of the capacitor with respect to the silicon substrate 1, and an n-type inversion layer is formed in the surface layer of the silicon substrate 1 below the thin insulating film 2, so that the capacitor can be charged through the MIS transistor. Charge accumulation can also be performed such that phosphorus is formed by ion implantation or thermal diffusion in the silicon substrate below the thin insulating film 2 to form an n-type conductive layer (not shown) instead of forming the n-type inversion layer.

In order to obtain a high-density 1Tr type dRAM, the memory cell area must be minimized. However, reduction of the memory cell area by the conventional method is difficult for the following various reasons.

Since a bird's beak is formed in the element isolation region in accordance with conventional selective oxidation, an element isolation width of about 1 μm or less can hardly be achieved. In addition, when the memory cell area is reduced by conventional techniques, the capacitor area is also reduced. The capacitance of the memory cell and its storable charge are decreased to result in a decrease in output signal voltage and a soft error immunity. However, if the thickness of the thin insulating film 2 is decreased so as to increase the capacitance of the memory cell, the breakdown voltage is decreased. As a result, the operating voltage must be reduced and then operating margins are reduced.

In order to resolve this problem, a trench capacitor structure has been proposed wherein a trench is formed in the surface layer of the silicon substrate to comprise a capacitor, as described in Technical Digest of International Electron Devices Meeting, pp. 319-322, 1983.

According to the above reference, a thin insulating film corresponding to the thin insulating film 2 is formed in the trench, and a thin conductive layer corresponding to the thin conductive layer 3 is filled in the trench. The effective capacitor area is increased without increasing the area of the capacitor on the substrate.

When a distance between adjacent trenches is shortened in the trench capacitor structure, a punchthrough occurs to shift the charge through the silicon substrate under the oxide film 4 and the channel stopper region 5. This phenomenon is called an intercell interference, which causes storage data loss. Therefore, miniaturizing and the packing density of the memory cells are limited.

SUMMARY OF THE INVENTION

It is, therefore, a principal object of the present invention to provide a semiconductor memory device and a method for manufacturing the same, wherein a memory cell area can be decreased as compared with that of a conventional semiconductor memory device, thereby increasing the packing density of the semiconductor memory device.

In order to achieve the above object of the present invention, there is provided a semiconductor memory device comprising memory cells respectively located at intersections of bit and word lines arranged in a matrix form, each of the memory cells being constituted by a single insulated gate transistor and a single capacitor, the semiconductor memory device further comprising trenches formed in a semiconductor substrate in a direction of thickness thereof, the trenches being arranged in a matrix form when viewed from a top thereof so as to surround corresponding memory cells, the capacitor comprising a first insulating film formed along a lower portion of a side wall surface of each trench formed in the direction of thickness of the semiconductor substrate and a capacitor electrode formed along the first insulating film so as to fill at least a lower portion of the trench, the transistor comprising a gate insulating film adjacent to the capacitor and formed along an upper portion of the side wall surface of the trench, a gate electrode formed along the gate insulating film so as to fill at least an area of a remaining upper portion of the trench, the gate electrode being insulated from the capacitor electrode through a second insulating film, and a diffusion region formed in a major surface of the semiconductor substrate which is adjacent to the gate insulating film, and the semiconductor memory device further comprising element isolation means between two adjacent ones of the memory cells.

BRIEF DESCRIPTION OF THE DRAWINGS

FIGS. 11A to 11L are respectively sectional views for explaining the steps in manufacturing the semiconductor memory device shown in FIGS. 7A to 7C;

FIGS. 12A to 12L are respectively sectional views for explaining the steps in manufacturing the semiconductor memory device of FIG. 9.

DESCRIPTION OF THE PREFERRED EMBODIMENTS

Figure 1:
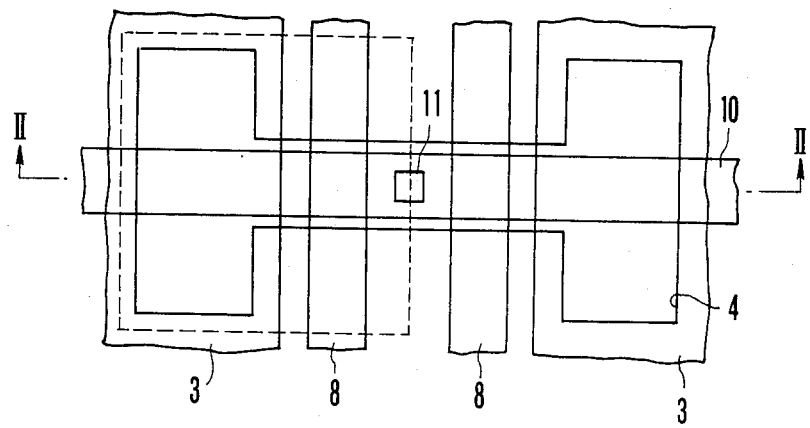
FIG. 1 is a plan view of a conventional semiconductor memory device as an n-channel MIS dRAM.
Figure 2:
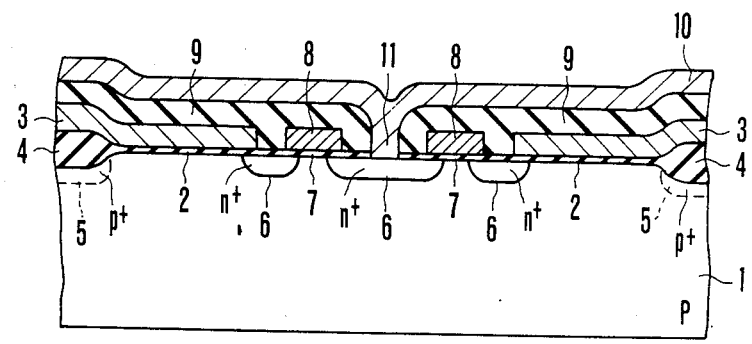
FIG. 2 is a sectional view of the semiconductor memory device shown in FIG. 1.
Figure 3A:
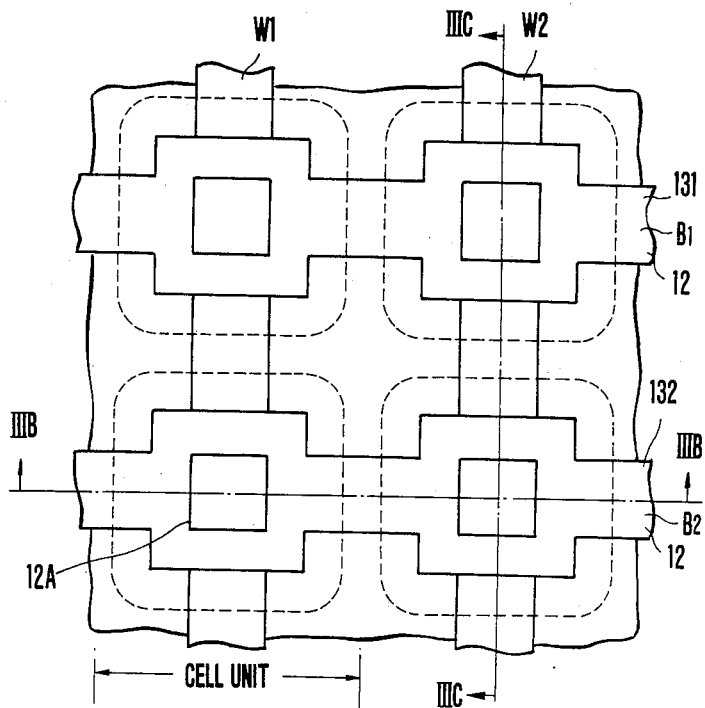
FIG. 3A is a plan view of a semiconductor memory device according to an embodiment of the present invention.
Figure 3B:
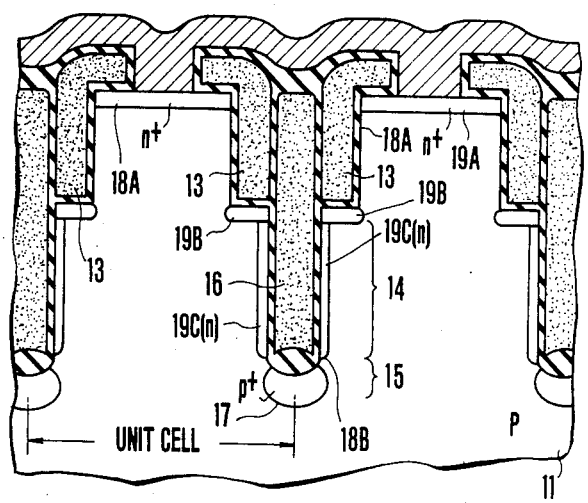
FIG. 3B is a sectional view of the semiconductor memory device taken along the line IIIB—IIIB of FIG. 3A.
Figure 3C:
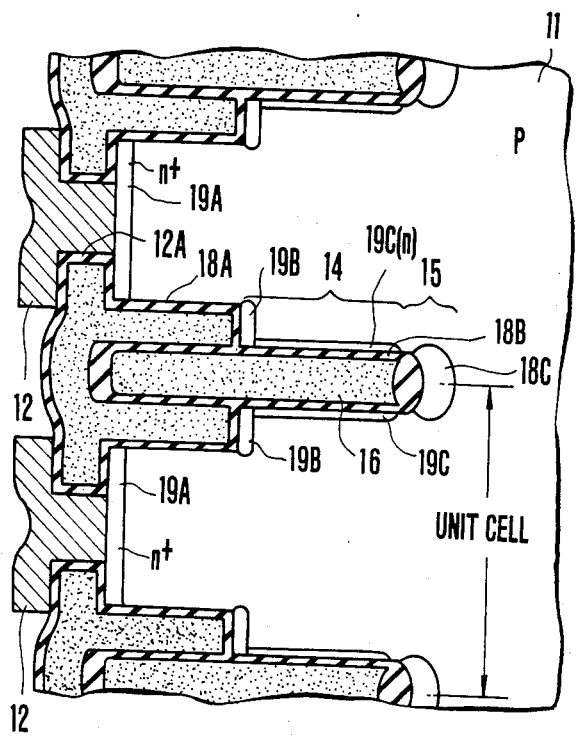
FIG. 3C is a sectional view of the semiconductor memory device taken along the line IIIC—IIIC of FIG. 3A.

FIGS. 3A to 3C respectively show a semiconductor memory device according to an embodiment of the present invention. Reference numeral 11 denotes a p-type silicon substrate; 12, an aluminum bit line; 12A, a bit line contact hole; 13, a polysilicon transfer gate of an insulated gate transistor which also serves as a word line; 14, a matrix- or grid-like trench capacitor; 15, an element isolation region; 16, a polysilicon cell plate constituting one electrode of the capacitor; 17, an isolation region of a p+-type region doped with a high concentration of an impurity of the same conductivity type as that of the substrate 11; 18A, 18B and 18C, insulating films, respectively; 19A and 19B, n+-type regions constituting source/drain regions of the insulated gate transistor, respectively; and 19C, an n-type region. The cell plates are led at a location (not shown) and are commonly connected. The bit lines and the word lines are arranged in a known matrix form. Each memory cell having one insulated gate transistor and one capacitor is located at each intersection of the matrix.

As is apparent from FIGS. 3B and 3C, a capacitor constituting one memory cell as well as a transistor thereof are formed in a trench. The transistor and the capacitor are vertically aligned along a direction of depth of the trench. In practice, the memory cells are respectively formed in the trenches arranged in a matrix form and are isolated by corresponding matrix-like trenches. A length of the transfer gate 13 will not adversely affect a memory cell area. The channel length can be sufficiently increased to limit a subthreshold leak current without preventing the high packing density of memory cell. The transfer gate 13 of the insulated gate transistor which is formed on the gate insulating film 18A on the side wall of the first trench formed in a major surface of the substrate 11 is not completely buried therein. The capacitor 14 is formed in a second trench having an opening at the bottom of the first trench. These trenches are self-aligned without lithographic techniques (to be described later). An alignment margin is required only between the edge of the first trench with the transfer gate 13 and the bit line contact hole 12A. The transfer gate 13 and the trench capacitor 14 are formed around the bit line contact hole 12A in a grid-like shape. The p+-type isolation region 17 and the isolation insulating film 18C of a thick oxide film (the film 18C is not necessarily formed) are formed between the cell plate 16 and the substrate 11, thereby minimizing interference between every two adjacent cells.

The n-type region 19C, i.e., a semiconductor region doped with an impurity having a conductivity type opposite to that of the substrate 11 is formed on the surface of the substrate 11 constituting the trench capacitor 14. The n-type region 19C serves to sufficiently charge the trench capacitor even when a cell plate potential is lower than a power supply voltage (the power supply voltage + the threshold voltage). When the cell plate potential is sufficiently higher than the power supply voltage, the n-type region 19C can be omitted. Since the n+-type source/drain region 19A for the transfer gate 13 is sufficiently in contact with the bit line 12, the n+-type source/drain region 19B is formed to eliminate a decrease in an electrical field at a thick insulating film portion at the edge of the first trench. The n+-type region 19B as a connecting portion with the trench capacitor is not necessarily formed. The n+-type region 19A can have a size slightly larger than that of the bit line contact hole 12A.

FIG. 3A is a plan view showing a pattern of 4 memory cells in the semiconductor memory device shown in FIGS. 3B and 3C. The memory cells are formed at intersections of bit lines B1 and B2 and word lines W1 and W2, respectively. When a design rule with an alignment margin of 0.3 μm is used, for example, the memory cell area can be decreased to 3 to 4 μm², i.e., ½ to ⅓ of a conventional memory cell without decreasing the capacitance, i.e., a memory capacity of the memory cell, thereby greatly improving the packing density of the memory cell.

A method of manufacturing the semiconductor memory device described above will be described with reference to FIGS. 4A to 4Q.

Figure 4A:
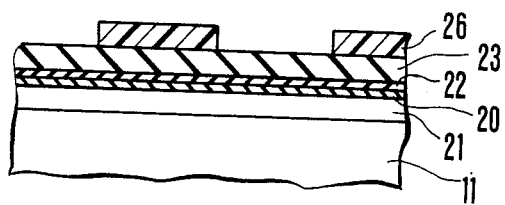
FIGS. 4A to 4Q are respectively sectional views for explaining the steps in manufacturing the semiconductor memory device shown in FIGS. 3A to 3C.

As shown in FIG. 4A, a first thermal oxide film 20 of 300 to 500 Å thickness is formed on a p-type silicon substrate 11. An n-type impurity is ion-implanted in the silicon substrate 11 to form an n+-type layer 21 thereon. A silicon nitride film 22 of 1,000 to 2,000 Å and a silicon oxide film 23 of 3,000 to 4,000 Å are sequentially formed by a known deposition technique on the surface of the first thermal oxide film 20, thereby obtaining a multilayer insulating film consisting of the layers 20, 22 and 23. A resist is coated on the entire surface of the silicon oxide film 23 and is patterned by a lithography technique to form a 1 μm wide resist matrix pattern 26.

Figure 4B:
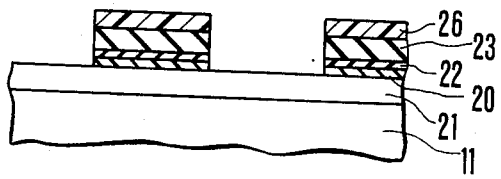

As shown in FIG. 4B, the multilayer insulating film is etched by reactive ion etching (RIE) using the pattern 26 as a mask. The major surface of the silicon substrate 11 is partially exposed to match with the resist pattern 26.

As shown in FIG. 4C, after the resist pattern 26 is removed, the silicon substrate 11 is etched about 1 μm by reactive ion etching using a multilayer insulating pattern as a mask. As a result, a matrix-like first trench A for a vertical transistor is formed.

As shown in FIG. 4D, in order to eliminate etching contamination and damage, it is preferable that the wall surface of the first trench is washed with nitrohydrofluoric acid solution. Thereafter, the overlying oxide film 23 constituting the multilayer film is removed. A thermal oxide film 27 of 200 to 300 Å serving as a gate oxide film of the vertical transistor is formed by thermal oxidation on the wall surface of the trench. An n+-type region 28 serving as a source/drain region is formed by ion implantation in the bottom region of the trench A. As previously described, the n+-type region 28 is not always necessary.

As shown in FIG. 4E, a polysilicon layer 29 of 2,500 to 3,000 Å thickness which serves as a gate electrode of the vertical transistor is deposited by a known technique in the trench so as not to completely fill the trench A. The entire surface of the polysilicon layer 29 is thermally oxidized to form an oxide film 30 of 300 to 500 Å thickness. Thereafter, a silicon nitride film 33 of 1,000 to 2,000 Å thickness and a silicon oxide film 51 of 3,000 to 4,000 Å thickness are sequentially formed by a known technique on the oxide film 30.

As shown in FIG. 4F, the portions of the silicon oxide film 51, the silicon nitride film 33 and the silicon oxide film 30 which are formed on the flat surface portions of the substrate 11 are removed by reactive ion etching to expose the surface of the polysilicon layer 29.

Figure 4G:
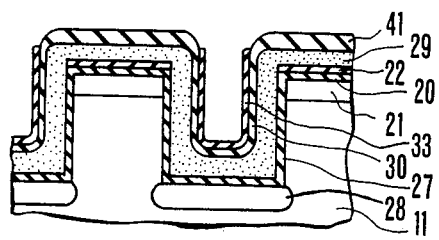

As shown in FIG. 4G, after the silicon oxide film 51 in the trench is removed, thermal oxidation is performed to form an oxide film 41 on only the exposed surface of the polysilicon layer 29.

Figure 4H:
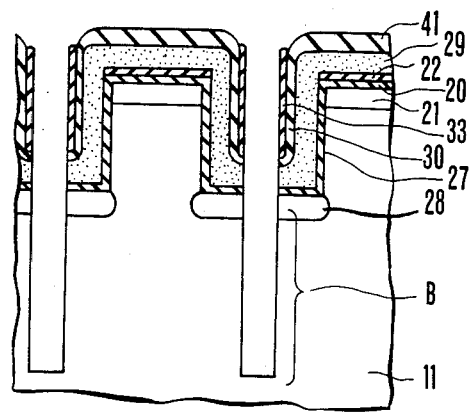

As shown in FIG. 4H, the bottom surface of the polysilicon layer constituting the gate electrode is etched to form an opening. The substrate 11 is then etched by reactive ion etching through the opening. Thus, the silicon nitride film 33, the silicon oxide film 27 and the silicon substrate 11 are etched to form a 2 μm deep matrix-like trench B in which the capacitor is formed.

Figure 4I:
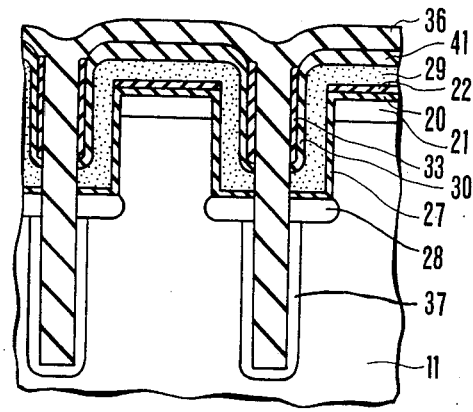

As shown in FIG. 4I, after the wall surface of the narrow trench is washed, a phosphorus-doped silicon oxide film 36 is filled in the trench. The oxide film 36 is thermally oxidized to form an n-type region 37 in a prospective capacitor region of the silicon substrate 11.

Figure 4J:
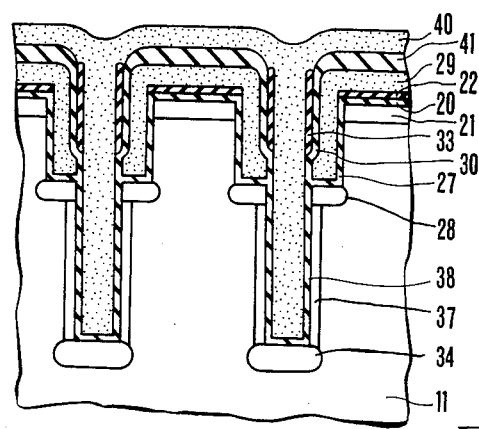

As shown in FIG. 4J, after the phosphorus-doped silicon oxide film 36 in the prospective trench capacitor region is removed, a 50 to 100 Å thick thermal oxide film 38 of the capacitor is formed, and a p-type impurity is ion-implanted to a high concentration to form a p+-type region 34 at the bottom flat surface of the prospective trench capacitor region. Subsequently, a 3,000 to 4,000 Å thick polysilicon layer 40 serving as the cell plate is formed by a known deposition technique in the trench.

Figure 4K:
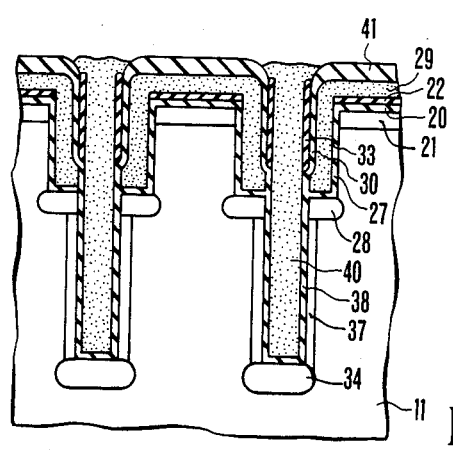

As shown in FIG. 4K, the upper portion of the polysilicon layer 40 which is formed on the flat surface is removed to expose the flat surface of the polysilicon oxide film 41.

Figure 4L:
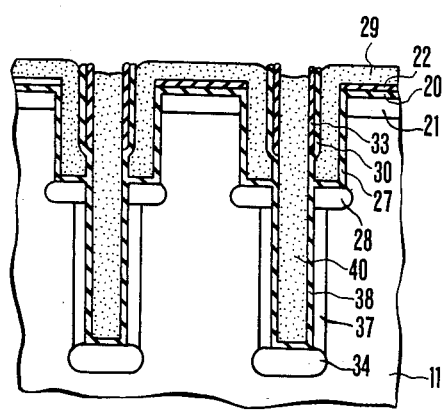

As shown in FIG. 4L, the polysilicon oxide film 41 is etched by a hydrofluoric acid etching solution from the upper portion of the trench to expose the gate electrode polysilicon layer 29.

Figure 4M:
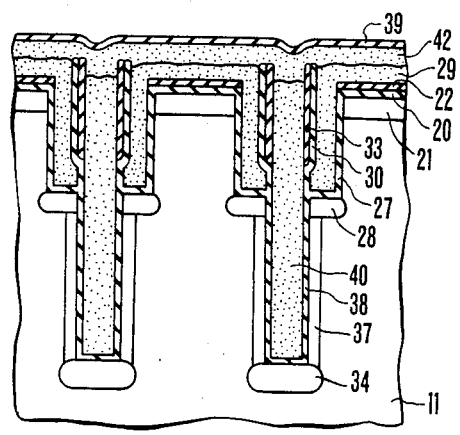

As shown in FIG. 4M, a word line polysilicon layer 42 of 3,000 to 4,000 Å thickness and a silicon nitride film 39 of 500 to 1,000 Å thickness are subsequently deposited on the entire surface of the resultant structure.

Figure 4N:
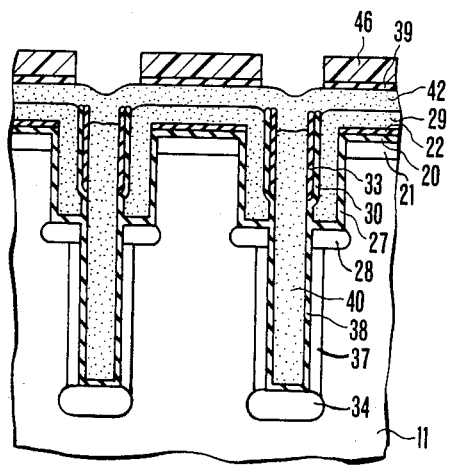

As shown in FIG. 4N, using a resist pattern 46 obtained by lithography as an etching mask, the portion of the silicon nitride film 39 which is formed at the upper portion of the trench is removed.

Figure 4O:
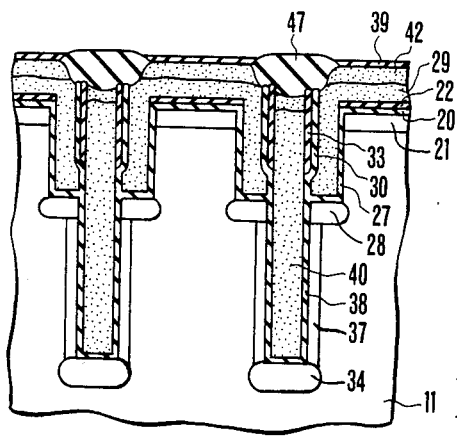

As shown in FIG. 4O, thermal oxidation is performed using a gas mixture of hydrogen and oxygen to selectively oxidize the portion of the polysilicon layer 42 which is immediately above the trench. As a result, a silicon oxide film 47 is formed immediately above the trench.

As shown in FIG. 4P, after the silicon nitride film 33 on the surface of the polysilicon layer 42 is removed, a thermal oxide film 43 is formed on the surface of the polysilicon layer 42. A contact hole for the bit line and the layer 21 is formed and the word lines are patterned by dry etching using a resist (not shown) patterned by lithography. Thereafter, thermal oxidation is performed again to form an oxide film 44 on the wall defining the bit line contact hole. The silicon nitride film 22 and the silicon oxide film 20 under the bit line contact hole are etched by reactive ion etching.

As shown in FIG. 4Q, a bit line aluminum layer 45 is deposited and patterned by lithographic and etching techniques. As a result, bit lines having a predetermined pattern are formed.

Figure 5:
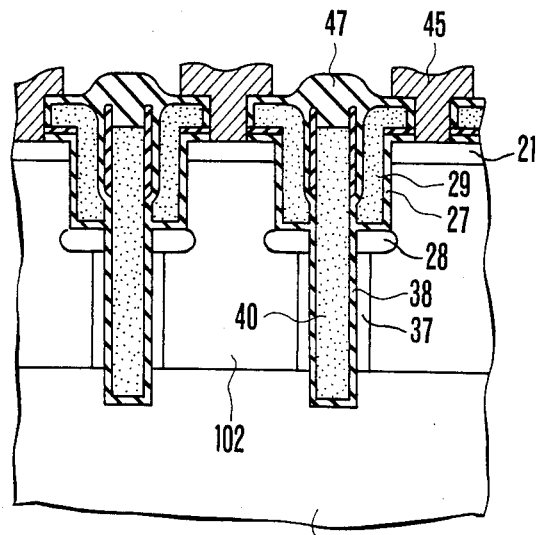
FIG. 5 is a sectional view showing a modification of the semiconductor memory device shown in FIGS. 3A to 3C.

In the above embodiment, the substrate comprises a p-type silicon substrate. However, a bulk substrate having a p+-type region and a p⁻-type epitaxial layer can be used in place of the p-type silicon substrate. The final step is illustrated in FIG. 5. In this case, the first trench A is formed only in a p⁻-type layer 102 on a p+-type region 101 when a trench for the vertical insulated gate transistor is formed in a step corresponding to that of FIG. 4C. The subsequent steps are the same as those described above to prepare a vertical transistor. The second trench B for the trench capacitor is formed to reach the p+-type region 101 in the same manner as in the step shown in FIG. 4H. In this case, ion implantation need not be performed to form the p+-type region 34 in the bottom layer of the trench, as shown in FIG. 4J. Since the epitaxial layer of a high impurity, i.e., p+is used, every two adjacent capacitors can be completely isolated from each other, thereby achieving an interference free structure between the cells.

In the above embodiment, the capacitor electrode is formed after the gate electrode of the insulated gate transistor such as a MISFET is formed. However, the formation order between the capacitor electrode and the gate electrode can be reversed in the following manner shown in FIGS. 6A to 6O.

Figure 6A:
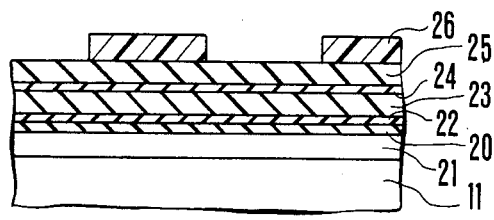
FIGS. 6A to 6O are respectively sectional views for explaining the steps in manufacturing the semiconductor memory device shown in FIG. 5.

As shown in FIG. 6A, after a first thermal oxide film 20 is formed on a p-type silicon substrate 11, a high-concentration n+-type layer 21 is formed in the same manner as described above. A silicon nitride film 22, a silicon oxide film 23, a silicon nitride film 24 and a silicon oxide film 25 of substantially the same thickness are sequentially deposited to form a multilayer insulating film. A 1 μm wide resist matrix pattern 26 is formed on the multilayer insulating film by a lithography technique.

Figure 6B:
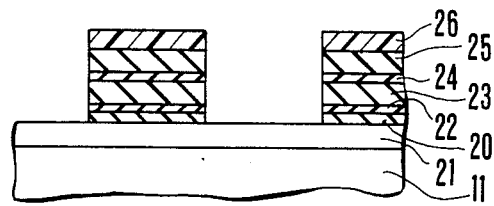

As shown in FIG. 6B, reactive ion etching is performed by using the resist pattern 26 as an etching mask to selectively remove the multilayer structure, thereby partially exposing the surface of the silicon substrate 11.

Figure 6C:
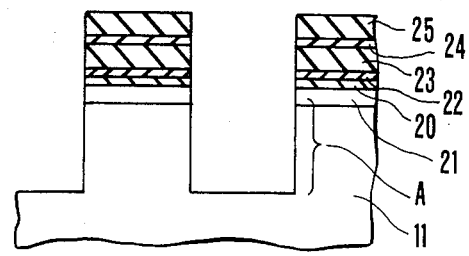

As shown in FIG. 6C, after the resist pattern 26 is removed, the silicon substrate 11 is etched back a depth of 1 μm by reactive ion etching using a multilayer film pattern. As a result, a matrix-like first trench A for forming the vertical transistor is formed.

Figure 6D:
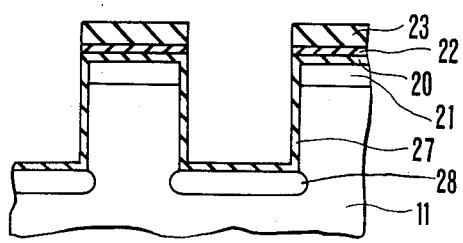

As shown in FIG. 6D, after the wall of the trench is washed in the same manner as described above, the overlying silicon oxide film 25 and the silicon nitride film 24 which constitute the multilayer pattern are removed. In the same manner as described above, thermal oxidation is performed to form a thermal oxide film 27 on the wall of the trench. Ion implantation is performed to form an n+-type layer 28 in a bottom layer of the trench.

Figure 6E:
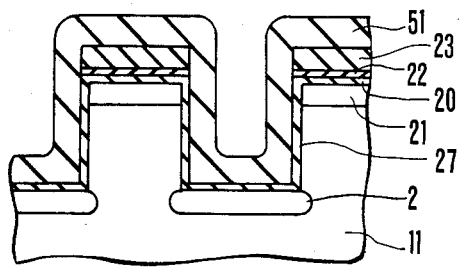

As shown in FIG. 6E, a silicon oxide film 51 is formed in the same manner as described above.

Figure 6F:
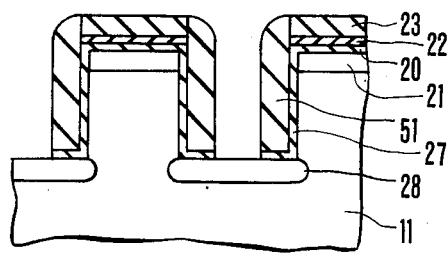

As shown in FIG. 6F, portions of the oxide film 51 which are formed in the upper portion of the trench and the flat bottom surface are removed by reactive ion etching. In other words, the oxide film 51 is left on only the wall surface of the trench.

Figure 6G:
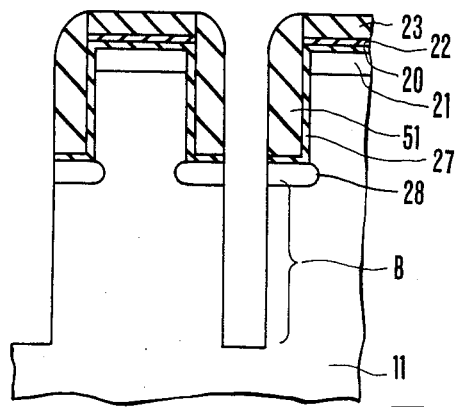

As shown in FIG. 6G, the substrate 11 is etched back through an opening between the opposing portions of the oxide film 51 at the bottom of the trench, thereby forming a matrix-like second trench B for forming a capacitor therein.

Figure 6H:
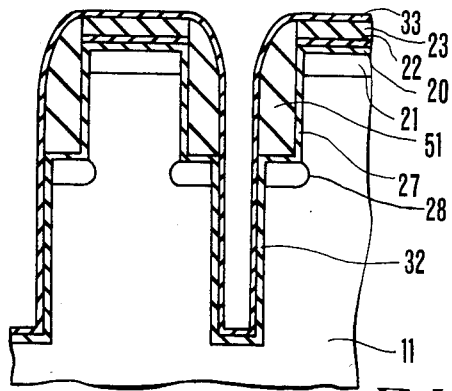

As shown in FIG. 6H, after the inner wall of the second trench is washed, thermal oxidation is performed to form a thermal oxide film 32 of 100 to 300 Å thickness. Thereafter, a silicon nitride film 33 of 1,000 to 1,500 Å thickness is formed to cover the entire surface of the resultant structure.

Figure 6I:
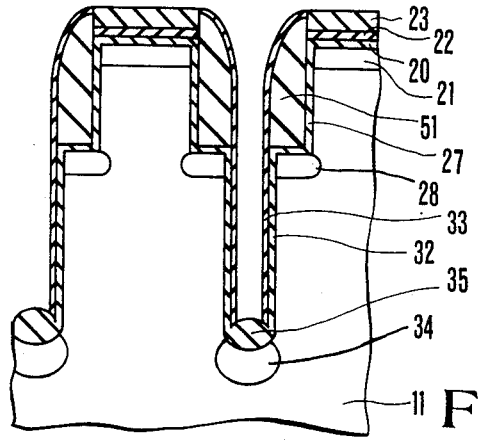

As shown in FIG. 6I, after the silicon nitride film 33 is removed by reactive ion etching from the upper portion of the trench and the bottom flat surface thereof, a p-type impurity is ion-implanted in the flat surface at the bottom of the capacitor region to form a p+-type region 34. The resultant structure is thermally oxidized in a gas mixture of hydrogen and oxygen, thereby selectively forming an isolation oxide film 35 in the trench bottom.

Figure 6J:
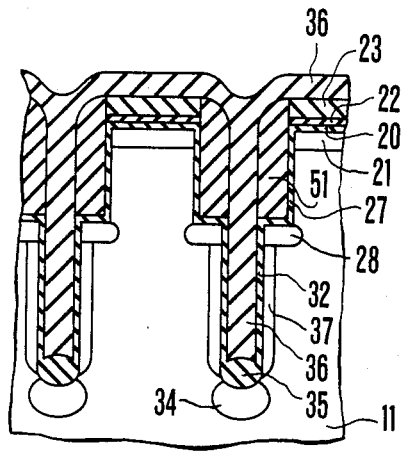

As shown in FIG. 6J, after the nitride film 33 in the wall surface of the trench is removed, a phosphorus-doped silicon oxide film 36 is formed in the trench. Phosphorus ions are diffused from the film 36 to a portion of the silicon substrate which defines the trench wall, thereby forming an n-type region 37.

Figure 6K:
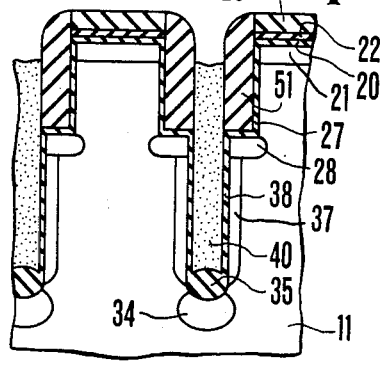

As shown in FIG. 6K, after the phosphorus-doped silicon oxide film 36 in the trench capacitor region and the thermal oxide film on the upper portion of the trench are removed, a capacitor thermal oxide film 38 of 50 to 100 Å thickness and then a cell plate polysilicon layer 40 of 3,000 to 4,000 Å thickness are formed by a known technique. The portion of the polysilicon layer 40 which is formed at the upper portion of the trench is removed by reactive ion etching.

Figure 6L:
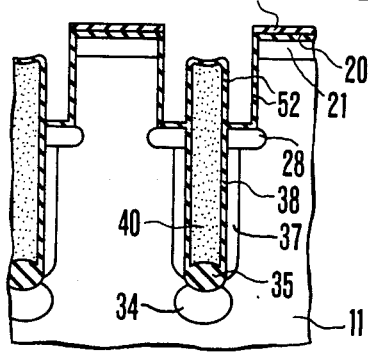

As shown in FIG. 6L, the oxide films 51 and 27 deposited on the side wall of the first trench and the oxide film 23 formed on the flat surface of the upper portion of the trench are etched. A thermal oxide film 52 serving as a transfer gate insulating film is formed on the surface of the first trench and on the surface of the cell plate polysilicon layer 40.

Figure 6M:
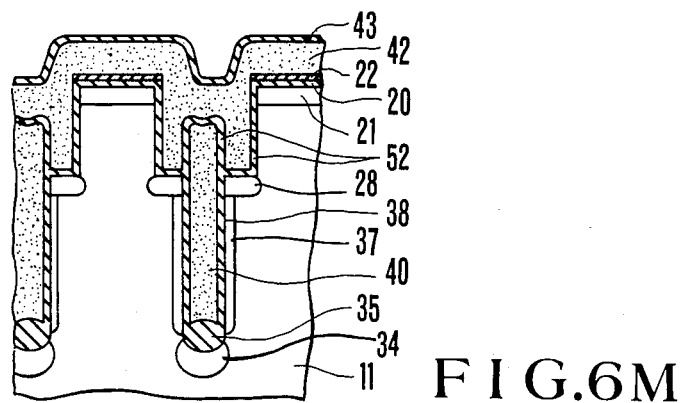

As shown in FIG. 6M, a polysilicon layer 42 for the transfer gate and the word line is deposited by a known technique, and the first trench is completely filled. Furthermore, a thermal oxide film 43 is formed to cover the entire surface of the resultant structure.

Figure 6N:
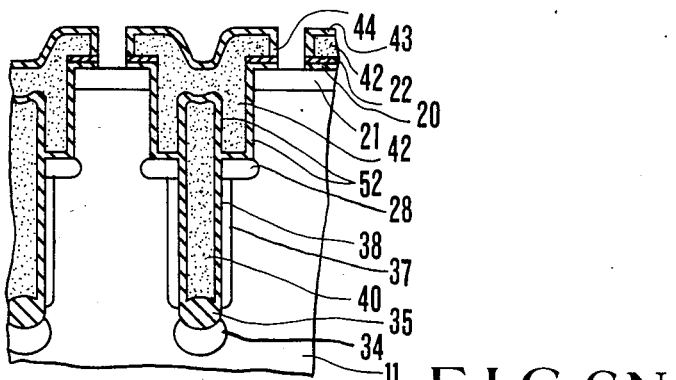

A resist film (not shown) is patterned by lithography to match with the bit line contact pattern and the word line pattern and is subjected to dry etching. Thereafter, thermal oxidation is performed again to form an oxide film 44 in the side wall surface of the bit line contact. The nitride film 22 and the oxide film 20 which are located immediately under the bit line contact are removed by reactive ion etching, as shown in FIG. 6N.

Figure 6O:
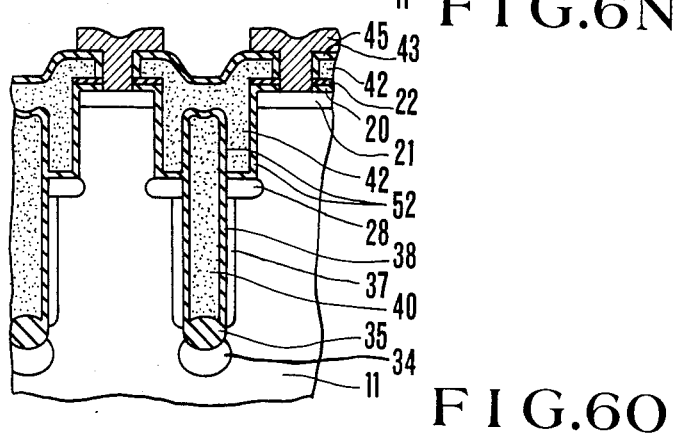

As shown in FIG. 6O, a bit line aluminum layer 45 is deposited and patterned by lithography and etching process, thereby forming the bit line.

In this case, since the second trench is formed by using the oxide film 51 as the etching mask for only the second trench, the etching operation can be accurately performed. The above method can also be applied to a bulk substrate with an epitaxial layer, as shown in FIG. 5.

The present invention is not limited to the particular embodiment described above. Various changes and modifications can be made within the spirit and scope of the invention. For example, the diffusion layer in the surface layer of the substrate can be formed before the trench is formed or after the bit line contact hole is formed. Furthermore, ion implantation after formation of the first trench for forming the transfer gate need not be performed, as described above. The n+-type layer 21 can be formed through the contact hole after the word line polysilicon layer 42 is formed. The formation of the isolation oxide film 35 at the bottom of the trench capacitor and formation of the n-type region 37 in the trench capacitor can be reversed. In addition, the isolation oxide film 35 need not be provided, as shown in FIGS. 5 and FIGS. 6A to 6O.

Although the phosphorus-doped oxide film 36 is used to form the n-type region 37, the n-type layer can be formed by diffusion.

Polysilicon is used to form the transfer gate since a polysilicon layer is formed by CVD and its surface layer must be oxidized. However, the transfer gate can comprise a silicide such as molybdenum silicide, tungsten silicide or titanium silicide. The bit line need not be formed by aluminum. A silicide selected from the silicides described above can be used.

A p-type silicon substrate is used in the above embodiment. However, an n-type silicon substrate can be used. In this case, the conductivity types of the respective regions are reversed. For example, phosphorus in the region 37 is replaced with a p-type impurity such as boron.

Figures 7A, 7B:
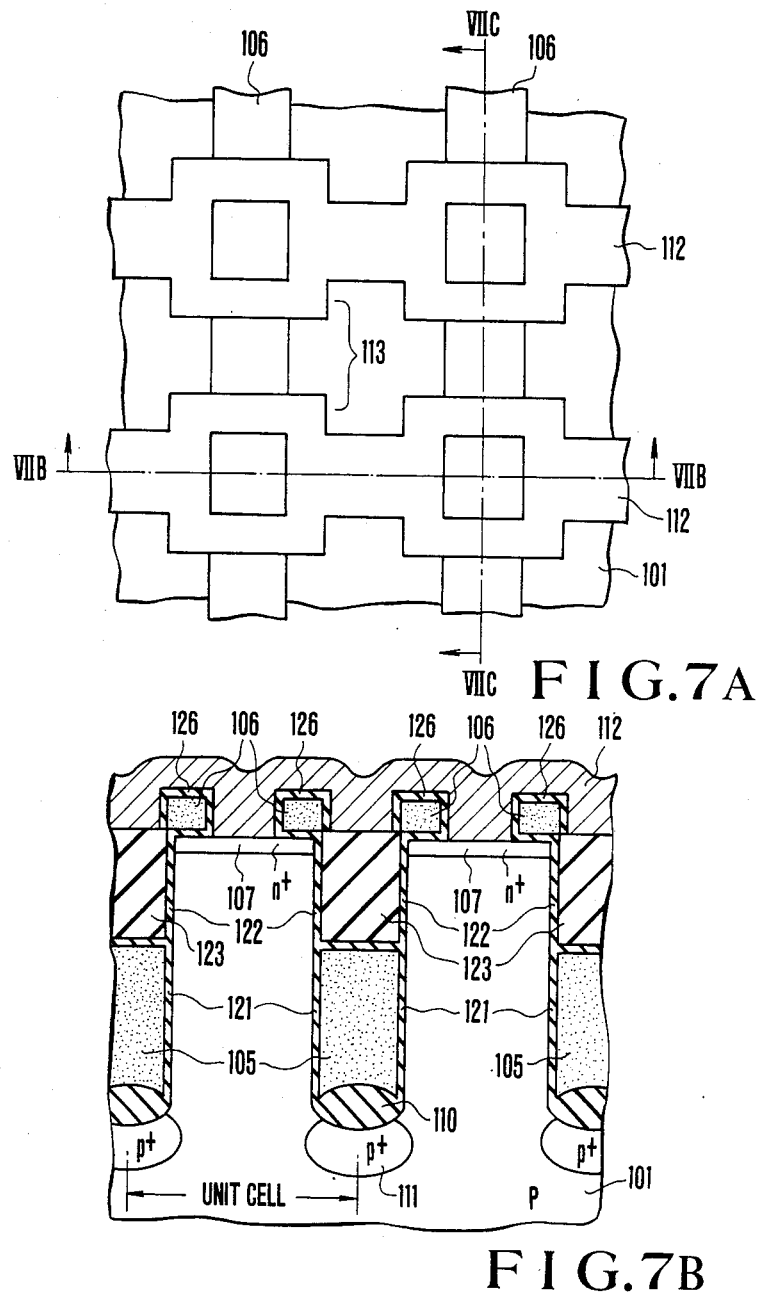
FIG. 7A is a plan view of a semiconductor memory device according to another embodiment of the present invention.
FIG. 7B is a sectional view of the semiconductor memory device taken along the line VIIB—VIIB of FIG. 7A.
Figure 7C:
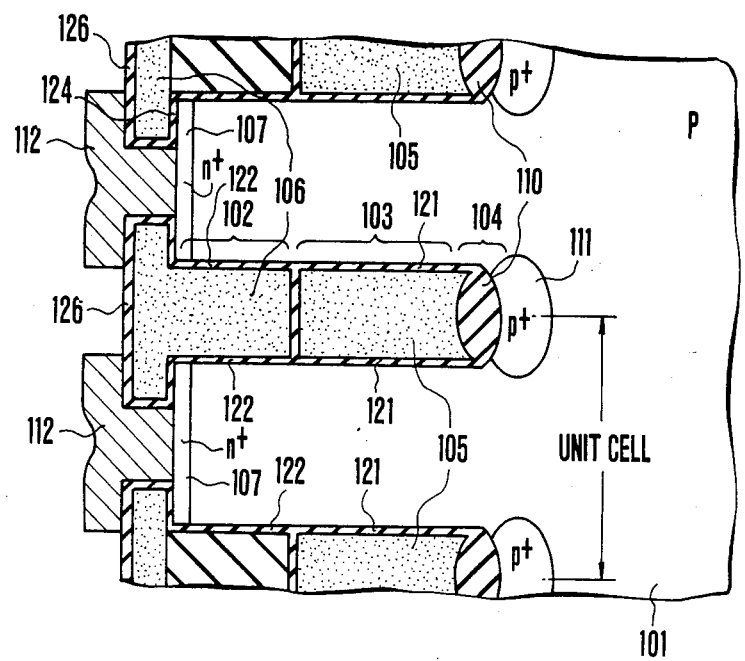
FIG. 7C is a sectional view of the semiconductor memory device taken along the line VIIC—VIIC of FIG. 7A.
Figure 8:
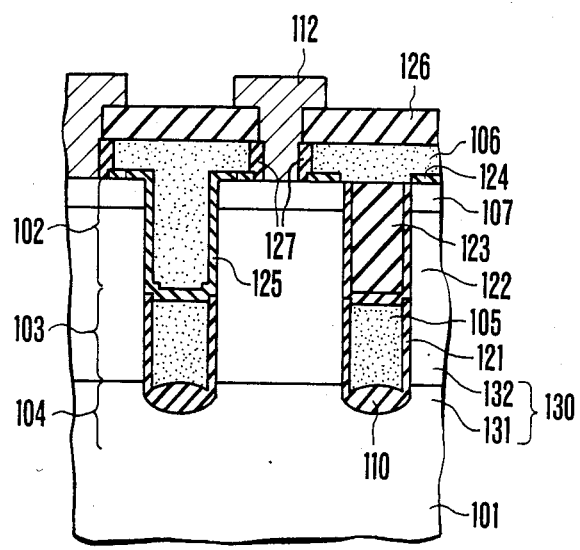
FIG. 8 is a sectional view showing a modification of the semiconductor memory device of FIGS. 7A to 7C.

FIGS. 7A, 7B and 7C respectively show a semiconductor memory device according to another embodiment of the present invention. Referring to FIGS. 7A to 7C, reference numeral 101 denotes a p-type silicon substrate; 102, an insulated gate transistor; and 103, a trench capacitor combined with the transistor to constitute one memory cell. It should be noted that the trenches are arranged in a matrix form, and that a region inside each trench serves as an element formation region in which a corresponding memory cell is formed. It should also be noted that the gate electrode is partially formed around the trench defining the element formation region. Reference numeral 104 denotes an element isolation region; 107, an n+-type region serving as one of source/drain regions of the transistor; and 105, a first conductive layer serving as one electrode of the capacitor. The electrodes of the capacitors of the respective memory cells are commonly connected and are connected to a predetermined position on the major surface of the silicon substrate 101. Reference numeral 106 denotes a second conductive layer which serves as the gate electrode of the transfer transistor 2 as well as the word line; and 121, 122, 123, 124, 125, 126 and 127, insulating films, respectively. Each memory cell is located at an intersection between a bit line 112 and the word line 106. The gate electrode 106 commonly used for the two transfer transistors is defined by a region 113 which is located between adjacent cells along a line parallel to the word line 106. The gate electrode 106 is connected to a predetermined position (not shown) on the major surface of the substrate 101. As is apparent from FIG. 7A, since the region with the gate electrode 106 is defined as the region 113, an overlapping area between the gate electrode 106 and the substrate 101 can be decreased. As a result, a word line capacitance can be decreased as compared with that of a conventional word line capacitance, thereby achieving a high-speed memory device with low power consumption. A thick insulating film 110 is formed on the bottom surface of the trench to achieve good element isolation. When the two adjacent elements are completely isolated from each other by another means, the film 110 need not be a thick film. Similarly, although a p+-type isolation region 111 is formed near the bottom of the trench, the region 111 can be omitted. In addition, the isolation region 111 need not be defined as a region near the bottom of the trench. As shown in FIG. 8, a p+-type region 131 can be formed at a predetermined depth in the wafer region including a portion near the bottom of the trench.

Referring to FIG. 8, reference numeral 132 denotes a p-type layer; and 130, a silicon bulk substrate which comprises at least the p-type layer 132 and a p+-type layer 131.

In the semiconductor memory device described above, the cell plate 105 serving as one electrode of the capacitor is electrically insulated from the substrate 101. This is because the cell plate 105 and the substrate 101 are kept at different potentials so as to sufficiently charge the capacitor 103. However, when at least a side wall surface portion which is located near the surface of the substrate and which has the capacitor 103 thereon comprises an n-type layer, the capacitor 103 can be sufficiently charged even if the cell plate 105 and the substrate 101 are kept at the same potential. In this case, the cell plate 105 can be connected to the substrate 101 at the bottom of the trench. With this arrangement, a voltage generator for applying a voltage to the cell plate and a contact connected to the cell plate 105 can be omitted, thereby decreasing the circuit area. At the same time, the resultant memory device can withstand noise, and its capacitor insulating film has high reliability.

Figure 9:
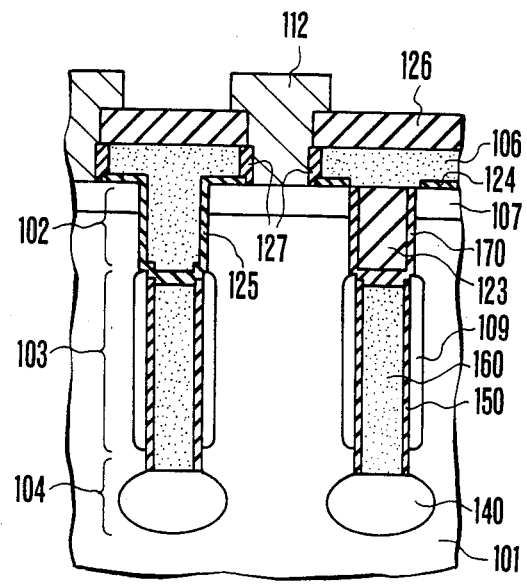
FIG. 9 is a sectional view showing a modification of the semiconductor memory device of FIGS. 7A to 7C.

A modification of the semiconductor memory device according to this embodiment is illustrated in FIG. 9. The same reference numerals in FIG. 9 denote the same parts as in FIGS. 7A to 7C. Referring to FIG. 9, an n-type region 109 is formed near the substrate surface defining the trench in which the capacitor 103 is formed. At the same time, a cell plate 160 is connected to the substrate 101 at the bottom of the trench. Reference numeral 140 denotes a p+-type isolation region; and 150 and 170, insulating films, respectively. In the semiconductor memory device exemplified in FIG. 9, the cell plate 160 is connected to the substrate 101 at the bottom of the trench. However, the cell plate 160 need not be connected to the substrate 101. Although the n-type region of the capacitor 103 is formed near the side wall of the trench, an n-type region 180 can be entirely formed within a predetermined range at a predetermined depth in the prospective capacitor region.

Figure 10:
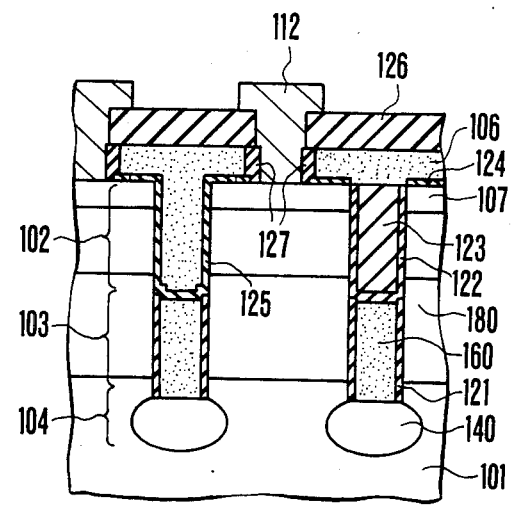
FIG. 10 is a sectional view showing a modification of the semiconductor memory device of FIG. 9.

Referring to FIGS. 9 and 10, the p+-type isolation region 140 is formed. However, it need not be formed. In the same manner as in the p+-type isolation region described with reference to the second embodiment of FIG. 7A, the p+-type isolation region 140 is not limited to be near the bottom of the trench, but a p+-type region 131 can be extended within a predetermined range at a predetermined depth so as to include a region near the bottom of the trench.

A method of manufacturing the semiconductor memory device as a finished device shown in FIGS. 7B and 7C will be described with reference to FIGS. 11A to 11L.

Figure 11A:
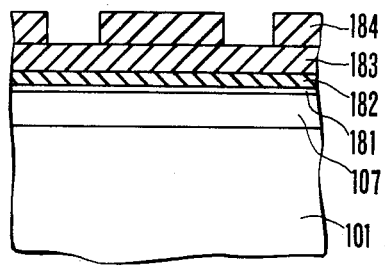

As shown in FIG. 11A, a first thermal oxide film 181 is formed on a p-type substrate 101, and ion implantation is performed to form an n+-type layer 107 in the surface layer of the substrate 101. A silicon nitride film 182 and a silicon oxide film 183 are sequentially formed by a known deposition technique on the first thermal oxide film 181 to constitute a multilayer insulating film. A resist is formed on the entire surface of the multilayer insulating film and is patterned by lithography and etched, thereby forming a resist matrix pattern 184.

Figure 11B:
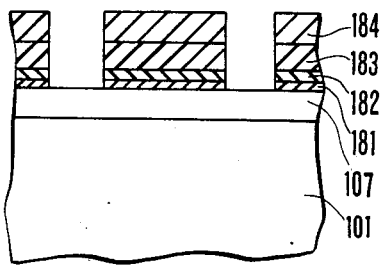

As shown in FIG. 11B, the multilayer film is etched by reactive ion etching using the resist pattern 184 as an etching mask to partially expose the surface of the substrate 101.

Figure 11C:
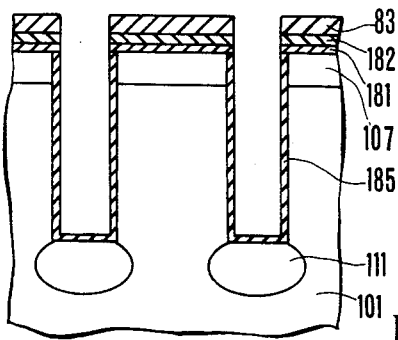

As shown in FIG. 11C, after the resist pattern 184 is removed, the substrate 101 is etched by reactive ion etching using the multilayer pattern as a mask, thereby forming a matrix-like trench. It is preferable that the wall surface of the trench is washed with a nitrohydrofluoric acid solution so as to eliminate etching contamination and damage. Thereafter, thermal oxidation is performed to form a thermal oxide film 185 on the wall surface of the trench, and ion implantation is performed to form a p+-type region 111 near the flat bottom surface of the trench.

Figure 11D:
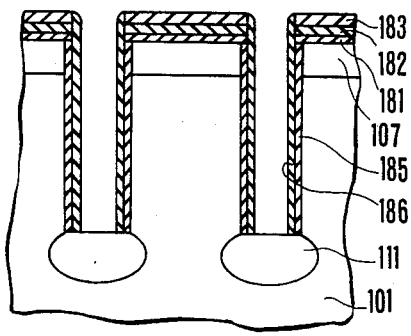

As shown in FIG. 11D, a silicon nitride film 186 is deposited by a known technique, and reactive ion etching is performed to remove the silicon nitride film 186 formed on only the flat surface, thereby exposing the substrate surface at the bottom of the trench.

Figure 11E:
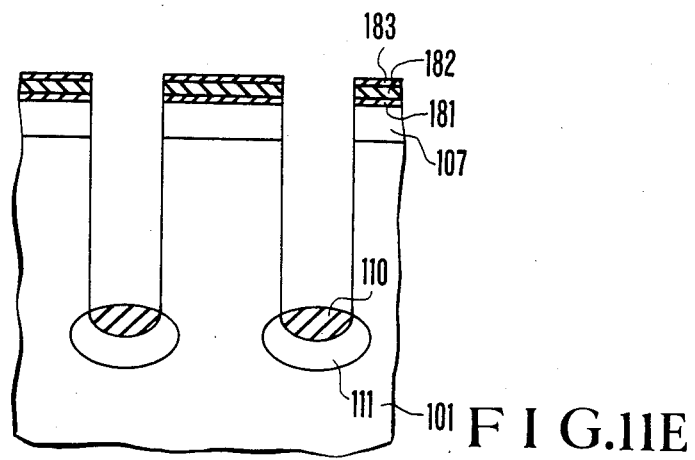

As shown in FIG. 11E, after the resultant structure is thermally oxidized in a gas mixture of hydrogen and oxygen to selectively form an isolation oxide film 110 on only the bottom of the trench, and the silicon nitride film 186 and the silicon oxide film 185 are removed.

Figure 11F:
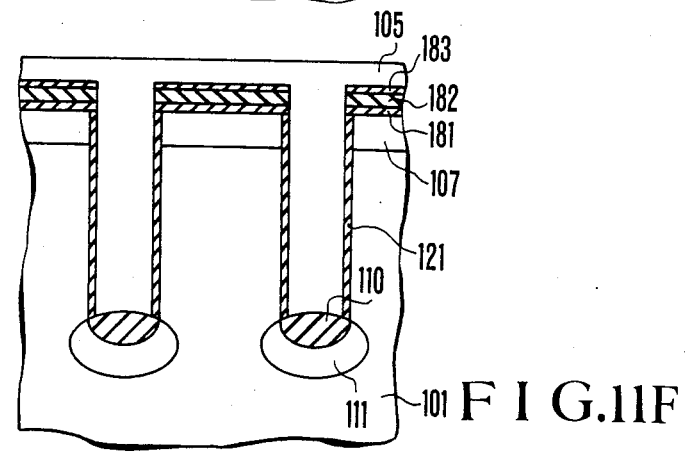

As shown in FIG. 11F, after an oxide film is formed by thermal oxidation on the surface of the substrate which defines the wall surface of the trench, a polysilicon layer 105 serving as the cell plate is deposited by a known technique in the trench.

Figure 11G:
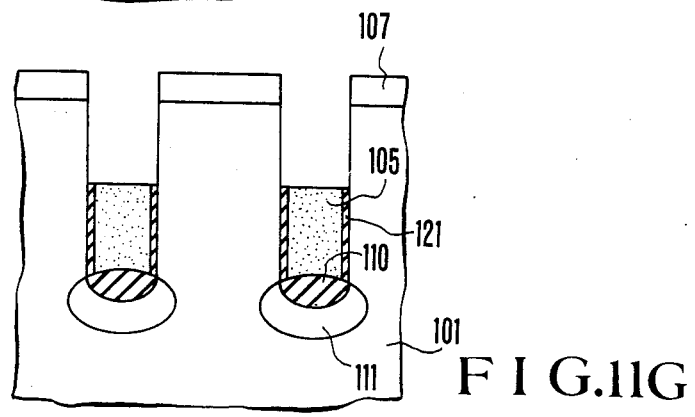

As shown in FIG. 11G, the polysilicon layer 105 is etched back by reactive ion etching such that the upper surface of the layer 105 is positioned at a predetermined level of the trench. Subsequently, the layers 183, 182 and 181 constituting the multilayer film are removed. In this case, a portion of an oxide film 121 which is above the upper surface of the polysilicon layer 105 is removed.

As shown in FIG. 11H, after a thermal oxide film 122 is formed on the exposed portion of the surface of the silicon substrate 101, a silicon oxide film 123 is formed by a known technique and filled in the trench. The silicon oxide film 123 is then etched back by reactive ion etching, so that the silicon oxide films 123 and 122 on the surface of the substrate are removed, thereby obtaining a substantially flat surface.

As shown in FIG. 11I, after an oxide film 124 is formed on the major surface of the substrate, a resist is formed on the entire surface of the resultant structure. The resist is patterned by lithography and etched to produce a transfer transistor window resist pattern 187.

As shown in FIG. 11J, a portion of the oxide film 123 which corresponds to a window is etched by using the resist pattern 187 as a mask. In this case, portions of the oxide films 124 and 122 which correspond to the window are also removed. After the resist pattern 187 is removed, an oxide film 125 is formed by thermal oxidation. Thereafter, a polysilicon layer 106 is deposited by a known technique on the entire surface of the substrate 101 which includes the window region.

Figure 11K:
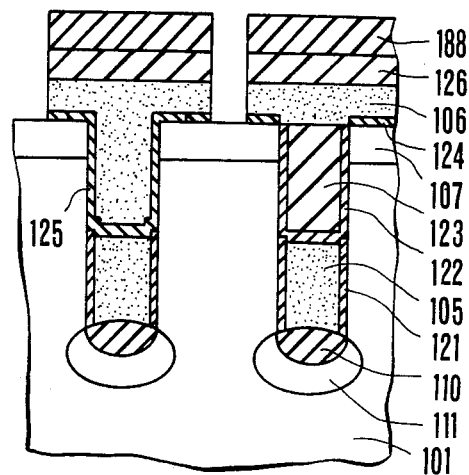

As shown in FIG. 11K, a resist is deposited on the entire surface of the resultant structure and patterned so as to match with the word line pattern. The structure is dry etched by using the resist pattern as a mask. After the resist pattern is removed, a silicon oxide film 126 is formed by a known technique to cover the entire surface. A resist is formed again on the silicon oxide film 126 and is patterned to obtain a pattern 188 serving as a bit line contact hole pattern. By using the resist pattern 188 as a mask, the oxide film 126, the polysilicon layer 106 and the oxide film 124 are removed to expose a surface portion of the substrate 101 which corresponds to the contact portion.

Figure 11L:
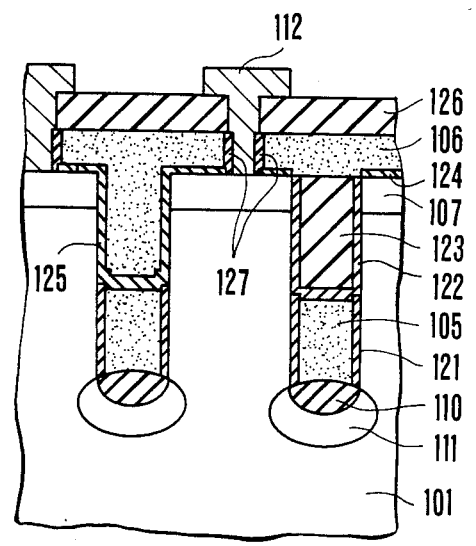

As shown in FIG. 11L, after the resist pattern 188 is removed, thermal oxidation is performed to form an oxide film 127 on the surface of the polysilicon layer 106 formed on the side wall surface of the bit line contact hole. In this case, since the oxide film is also formed on the surface of the substrate 101 which serves as the bit line contact portion, this oxide film is removed by reactive ion etching to expose the surface of the substrate 101. A bit line aluminum layer 112 is deposited to cover the entire surface and is patterned and etched, thereby obtaining a bit line pattern.

In this embodiment, the isolation oxide film 110 is formed by thermal oxidation (FIG. 11E). However, this oxide film can be formed by CVD or the like. In this case, after an impurity is ion-implanted to form the isolation region 111 (this step corresponds to that of FIG. 11C) and a silicon oxide film is filled by a known technique in the trench, the silicon oxide film can be etched by reactive ion etching so as to obtain a predetermined thickness. A polysilicon layer 105 is formed and the subsequent operations are the same as those (steps after step of FIG. 11F) of FIGS. 7A to 7C.

As described in the semiconductor memory device of FIGS. 7A to 7C, the isolation oxide film need not be thick. In this case, a series of steps (corresponding to steps of FIGS. 11D and 11E) for forming the oxide film 110 can be omitted.

In the device of FIG. 7, the isolation high-concentration region 111 is formed by ion implantation near the bottom of the trench. However, the region 111 need not be formed by ion implantation. In addition, the formation region is not limited to the portion near the bottom of the trench, but can be extended to a region within a predetermined range including the bottom of the trench at a predetermined depth. In this case, a bulk substrate has a p+-type layer and a p-type epitaxial layer thereon, and the trench reaches the underlying p+-type layer. The high-concentration region can be omitted. In this case, the step (FIG. 11C) of forming the high-concentration region is omitted.

As described in the semiconductor memory device of FIG. 9, the n-type region 109 can be formed near the side wall surface of the trench in which the capacitor 103 is formed. A method of manufacturing the semiconductor memory device as a finished device shown in FIG. 9 will be described with reference to FIGS. 12A to 12L.

As shown in FIG. 12A, in the same manner as in the semiconductor memory device of the second embodiment shown in FIGS. 7B and 7C, a thermal oxide film 181 is formed on a substrate 101, and an n+-type layer 107 is formed by ion implantation. A silicon nitride film 182 and a silicon oxide film 183 are sequentially deposited on the thermal oxide film 181. Subsequently, a matrix-like resist film is formed on the silicon oxide film 183 and patterned by lithography to obtain a resist pattern 184. The multilayer film consisting of the layers 183, 182 and 181 is etched using the resist pattern 184, thereby partially exposing the surface of the substrate 101.

As shown in FIG. 12B, after the resist pattern 184 is removed, matrix-like trenches are formed at a predetermined depth by using the multilayer film pattern (consisting of the layers 183, 182 and 181). It is preferable that the resultant trenches are washed with a nitrohydrofluoric acid solution. A silicon oxide film 191 is formed by a known technique.

As shown in FIG. 12C, the oxide film 191 deposited on the entire surface is removed by reactive ion etching from the bottom of the trench. In this case, the oxide film 191 is left on the side wall surface of the trench.

As shown in FIG. 12D, by using as masks the oxide film 191 and the layers 183, 182 and 181, trenches are formed again by reactive ion etching and washed with the nitrohydrofluoric acid solution.

Figure 12E:
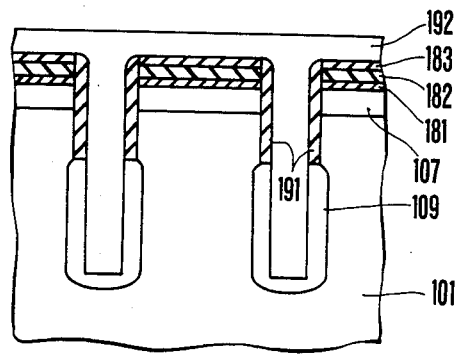

As shown in FIG. 12E, a phosphorus-doped polysilicon layer 192 is deposited on the entire surface so as to fill the trenches. Phosphorus is diffused from the layer 192 to the exposed surface portion of the substrate which defines each trench, thereby forming an n-type region 109. In this case, the oxide film 191 serves as a diffusion mask, so that a side wall excluding the prospective capacitor region in the trench is not converted to an n-type region.

Figure 12F:
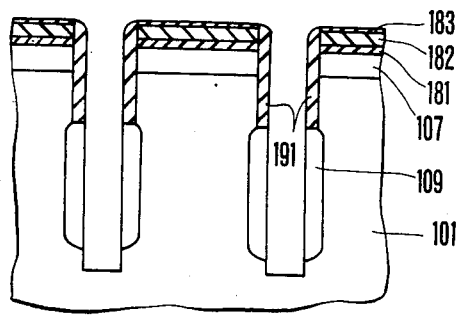

As shown in FIG. 12F, after the phosphorus-doped polysilicon layer 192 is removed, trenches are formed again by reactive ion etching using as masks the oxide film 191 and the layers 183, 182 and 181 such that the trench bottom is located below the n-type region 109. It is preferable that the trenches are then washed again with the nitrohydrofluoric acid solution.

Figure 12G:
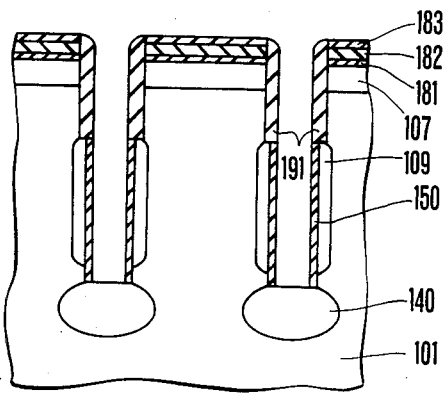

As shown in FIG. 12G, after a thermal oxide film 150 is formed, a p+-type region 140 is formed by ion implantation near the bottom of the trench. The oxide film 150 on the flat bottom surface of the trench is removed by reactive ion etching, thereby exposing the bottom surface of the trench which is the surface of the substrate 101.

Figure 12H:
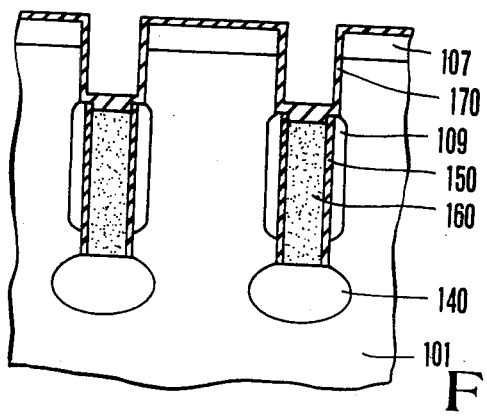

As shown in FIG. 12H, after a polysilicon layer 160 is filled in the the trench, the layer 160 is etched back by reactive ion etching such that the upper surface of the polysilicon layer 160 is located at a predetermined level. Thereafter, the silicon oxide film 183 is removed. In this case, the oxide film 191 is also removed. Subsequently, the silicon nitride film 182 and the oxide film 181 are removed. A thermal oxide film 170 is formed by thermal oxidation.

Figure 12I:
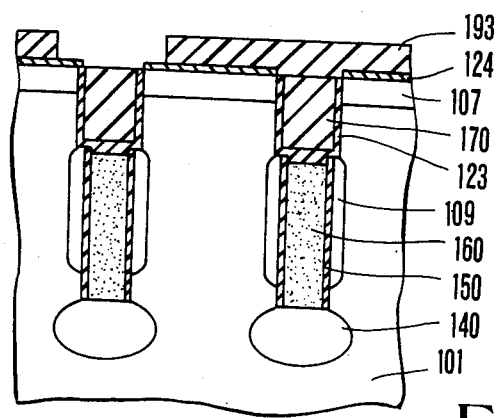

As shown in FIG. 12I, after a silicon oxide film 123 is formed in the trench by the same steps (corresponding to steps after the step of FIG. 11G) as in the device of FIGS. 7A to 7C, the silicon oxide film 123 is etched back by reactive ion etching. The oxide films 123 and 170 on the major surface of the substrate 101 are removed, thereby obtaining a substantially flat major surface. A thermal oxide film 124 is formed on the flat major surface of the substrate 101. A resist film is formed and patterned by lithography to obtain a resist pattern 193.

Figure 12J:
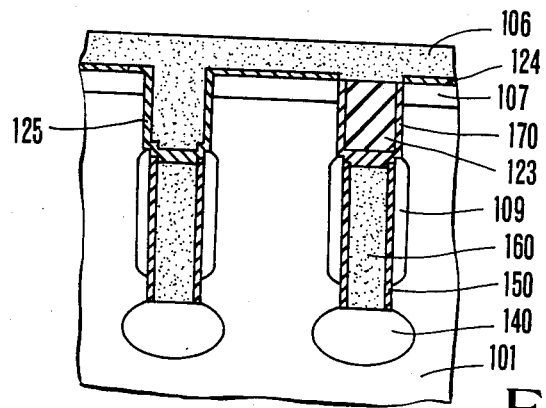

As shown in FIG. 12J, portions of the silicon oxide film 123 and the thermal oxide film 170 which correspond to the window of the resist pattern 193 as a mask. In this case, the portion of the oxide film 124 which corresponds to the window region is also removed. After the resist pattern 193 is removed, a thermal oxide film 125 is formed. A polysilicon layer 106 is formed to cover the entire surface of the major surface of the substrate 101 which includes the window region.

Figure 12K:
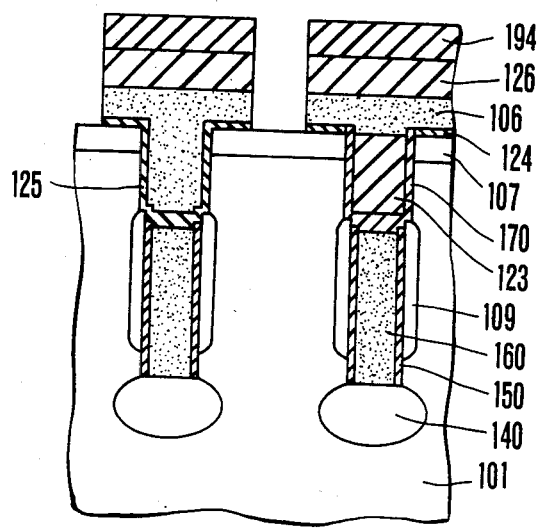

As shown in FIG. 12K, after a resist film is deposited and patterned by lithography to obtain a resist pattern, the polysilicon layer 106 is etched by dry etching to form a word line pattern. The resist pattern is then removed. A silicon oxide film 126 is deposited and patterned to obtain a contact hole resist pattern 194. By using the pattern 194 as a mask, the polysilicon layer 106 and the oxide film 124 are patterned to expose the portion of the substrate which corresponds to a contact hole.

Figure 12L:
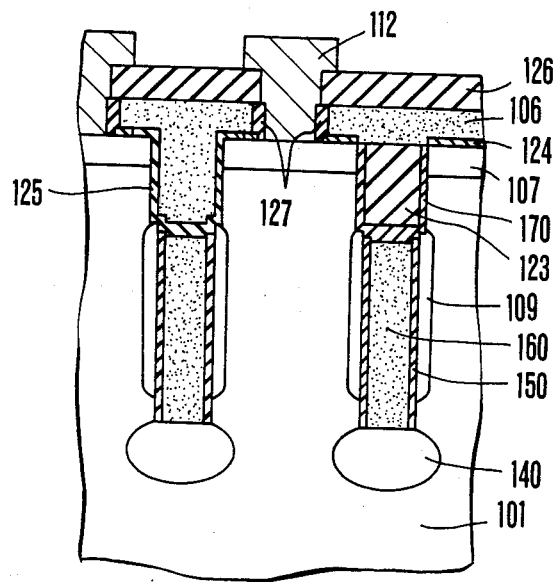

As shown in FIG. 12L, after the resist pattern 194 is removed, a thermal oxide film 127 is formed by thermal oxidation on the surface of the polysilicon layer 106 which defines the wall surface of the contact hole. In this case, an oxide film is also formed on the surface of the substrate 101 which is adjacent to the contact hole. This oxide film is removed by reactive ion etching to expose the surface of the substrate 101. A bit line aluminum layer 112 is deposited on the entire surface and is patterned and etched to obtain a final bit line pattern.

In the semiconductor memory device of FIG. 9, the phosphorus-doped polysilicon layer 192 is used as an impurity diffusion source for forming the n-type region 109 of the capacitor 103. However, phosphosilicate glass or a gas such as $POCl_2$ may be used, or the n-type region 109 may be formed by ion implantation. A modification of the device shown in FIG. 9 will be described with reference to FIGS. 13A to 13D.

Figure 13A:
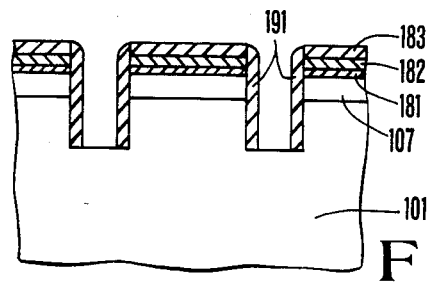
FIGS. 13A to 13D are respectively sectional views for explaining the steps in manufacturing a modification of the semiconductor memory device shown in FIG. 10.

As shown in FIG. 13A, in the same manner as in FIGS. 12A to 12L, after a trench matrix pattern is formed, the side walls of the trenches are covered with a silicon oxide film 191, and the flat bottom surfaces (i.e., the surface of the substrate 101) of the trenches are exposed (corresponding to FIG. 12C).

Figure 13B:
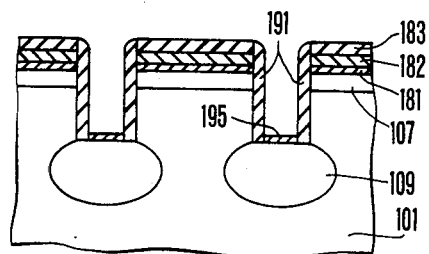

As shown in FIG. 13B, after a thermal oxide film 195 is formed, an n-type region 109 is formed by ion implantation using the oxide film 191 and layers 181, 182 and 183 as masks. The n-type region 109 is located near the bottom of the trench.

Figure 13C:
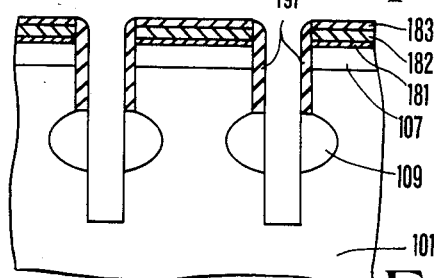

As shown in FIG. 13C, after the oxide film 195 is removed by reactive ion etching, trenches are formed using as masks the oxide film 191 and the layers 181, 182 and 183 so that the bottoms of the trenches are located below the n-type region 109. The trenches are washed with the nitrohydrofluoric acid solution.

Figure 13D:
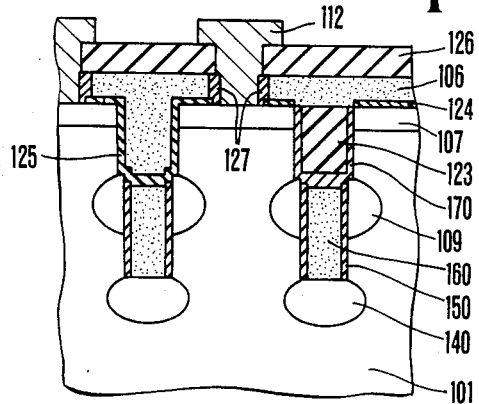

After the trench wall surface is oxidized, a p+-type region 140 (corresponding to the step of FIG. 12G) is formed and subsequent steps are performed in the same manner as in the semiconductor memory device of FIG. 9, thereby obtaining the finished device shown in FIG. 13D.

According to the device of FIG. 9, the layers 181, 182 and 183 and the silicon oxide film 191 are used as masks to prevent the side wall surface excluding the capacitor region from being converted to an n-type region. However, when ion implantation is performed to cover the entire area of the cells before the layers 182 and 183 are formed, thereby obtaining the n-type region 180 at a predetermined depth where the capacitor 103 is formed as shown in FIG. 10, the masks described above can be omitted. The same steps of manufacturing the device of FIG. 9 can be employed.

According to the semiconductor memory device of FIG. 9, the cell plate 160 is connected to the substrate 101 at the bottom of the trench, but need not be connected thereto. In this case, the step (FIG. 12G) for removing the oxide film 150 from the flat bottom surface of the trench by reactive ion etching can be omitted.

A technique for forming the p+-type region 140 is not limited to ion implantation in the same manner as in formation of the isolation high-concentration region described with reference to the semiconductor memory device of FIG. 7A to 7C. The silicon substrate can comprise a bulk substrate having a p+-type layer and a p-type epitaxial layer thereon, and the trench may be formed to reach the p+-type layer. Furthermore, the p+-type region 140 can be eliminated. In this case, the ion implantation step (FIG. 12G) of forming the p+-type region 140 is omitted.

The present invention is exemplified by the particular embodiments described above but is not limited to these. In the above embodiments, polysilicon is used as a material which can be formed by CVD and oxidized so as to form the cell plate and the gate electrode/word line of the transfer transistor. However, such a material is not limited to polysilicon but can be extended to molybdenum, tungsten or a silicide thereof. The bit line material is not limited to aluminum but can be extended to another metal or a silicide. Different oxide films used as insulating films are not limited to the examples but can be extended to PSG, or BPSG or another insulating film such as a silicon nitride film. A method of forming the insulating film is not limited to a specific technique. In the above embodiments, the substrates comprise p-type silicon substrates. When an n-type substrate is used, the conductivity types of the respective regions are reversed.

In the manufacturing process, etching gases such as $CF_4$ and $C_2F_6$ are used as $SiO_2$ etching gases. Etching gases such as $CF_4$, $CCl_4$ and $CF_3Br$ are used as Si(poly-Si) etching gases.

As described above, the diffusion layer in the surface layer of the substrate can be formed before the trench is formed or after the bit line contact hole is formed.

What is claimed is:

1. A semiconductor memory device comprising memory cells respectively located at intersections of bit and word lines arranged in a matrix form, each of said memory cells being constituted by a single insulated gate transistor and a single capacitor, said semiconductor memory device further comprising trenches formed in a semiconductor substrate in a direction of thickness thereof, said trenches being arranged in a matrix form when viewed from a top thereof so as to surround corresponding memory cells, said capacitor comprising a first insulating film formed along a lower portion of a side wall surface of each trench formed in the direction of thickness of the semiconductor substrate and a capacitor electrode formed along said first insulating film so as to fill at least a lower portion of said trench, said transistor comprising a gate insulating film adjacent to said capacitor and formed along an upper portion of said side wall surface of said trench, a gate electrode formed along said gate insulating film so as to fill at least an area of a remaining upper portion of said trench, said gate electrode being insulated from said capacitor electrode through a second insulating film, and a diffusion region formed in a major surface of said semiconductor substrate which is adjacent to said gate insulating film, and said semiconductor memory device further comprising element isolation means between two adjacent ones of said memory cells.

2. A device according to claim 1, wherein
said trench comprises a first trench formed to extend from said major surface of said semiconductor substrate along the direction of thickness thereof and a second trench formed to extend from a bottom of said first trench along the direction of thickness, said second trench having a smaller width than that of said first trench,
said first insulating film constituting said capacitor is formed along said second trench,
said gate insulating film constituting said transistor is formed along said first trench,
said capacitor electrode extends into said first trench,
said gate electrode is formed to fill the remaining upper portion so as to surround said diffusion region, and
a side wall surface of said first trench serves as a channel region of said transistor.

3. A device according to claim 2, wherein an impurity region is formed in a portion of said semiconductor substrate which defines the side wall surface of said second trench, said impurity region having a conductivity type different from that of said semiconductor substrate.

4. A device according to claim 3, wherein another impurity region having a conductivity type different from that of said semiconductor substrate is formed in a portion of said semiconductor substrate which defines the bottom of said first trench.

5. A device according to claim 2, wherein said first and second trenches for said two adjacent memory cells are common, and said capacitor electrodes of two adjacent capacitors of said two adjacent memory cells are common.

6. A device according to claim 2, wherein said element isolation means is formed in a bottom of said second trench and comprises a third insulating film having a thickness larger than said first insulating film constituting said capacitor.

7. A device according to claim 6, wherein said element isolation means further has a high-concentration impurity diffusion layer having the same conductivity type as that of said semiconductor substrate and formed in said semiconductor substrate under said third thick insulating film.

8. A device according to claim 2, wherein said element isolation means comprises a high-concentration impurity semiconductor region which is formed in a portion of said semiconductor substrate which corresponds to a bottom of said second trench and which has the same conductivity type as that of said semiconductor substrate.

9. A device according to claim 2, wherein said semiconductor substrate comprises a first layer containing an impurity of a first conductivity type and a second layer which is formed on said first layer, which has the same conductivity type as that of said first layer and which contains an impurity at a lower concentration than that of said first layer, a lower end of said first insulating film constituting said capacitor in said second trench being formed in said first layer.

10. A device according to claim 1, wherein
said trench has an opening area at an upper portion which is substantially the same as that at a bottom thereof,
said first insulating film constituting said capacitor is formed at said lower portion of said side wall surface of said trench,
said gate insulating film constituting said transistor is formed at said upper portion of said side wall surface of said trench,
said capacitor electrode is filled in said lower portion of said trench,
said gate electrode constituting said transistor is partially formed on said second insulating film, which is arranged on said capacitor electrode along the circumferential direction of said trench, so as to bury an area of said remaining upper portion of said trench, and
another remaining upper portion of said trench which is not filled with said gate electrode is filled with a fourth insulating film.

11. A device according to claim 10, wherein said element isolation means is formed in a bottom of said trench and comprises a third insulating film having a thickness larger than said first insulating film constituting said capacitor.

12. A device according to claim 11, wherein said element isolation means further has a high-concentration impurity diffusion layer having the same conductivity type as that of said semiconductor substrate and formed in said semiconductor substrate under said third thick insulating film.

13. A device according to claim 10, wherein said element isolation means comprises a high-concentration impurity semiconductor region which is formed in a portion of said semiconductor substrate which corresponds to a bottom of said trench and which has the same conductivity type as that of said semiconductor substrate.

14. A device according to claim 10, wherein said semiconductor substrate comprises a first layer containing an impurity of a first conductivity type and a second layer which is formed on said first layer, which has the same conductivity type as that of said first layer and which contains an impurity at a lower concentration than that of said first layer, a lower end of said first insulating film constituting said capacitor in said trench being formed in said first layer.

* * * * *